(12) United States Patent
Chiba

(10) Patent No.: US 6,702,891 B2
(45) Date of Patent: *Mar. 9, 2004

(54) METHOD OF HEAT TREATING FLUORIDE CRYSTAL

(75) Inventor: Takao Chiba, Ryugasaki (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/521,381

(22) Filed: Mar. 8, 2000

(65) Prior Publication Data
US 2002/0182863 A1 Dec. 5, 2002

(30) Foreign Application Priority Data
Mar. 11, 1999 (JP) .......................................... 11-064934

(51) Int. Cl.$^7$ ............................................. C30B 33/02
(52) U.S. Cl. ..................... 117/2; 117/3; 117/4; 117/940
(58) Field of Search ............................. 117/2, 3, 4, 940

(56) References Cited

U.S. PATENT DOCUMENTS

| 3,673,049 | A | * | 6/1972 | Giffen et al. ................ 161/164 |
| 4,038,448 | A | * | 7/1977 | Boyd et al. .................. 428/212 |
| 6,146,456 | A | * | 11/2000 | Mizugaki et al. .............. 117/2 |
| 6,226,128 | B1 | * | 5/2001 | Shiozawa .................... 359/642 |
| 6,238,479 | B1 | * | 5/2001 | Oba ............................ 117/68 |
| 6,270,570 | B2 | | 8/2001 | Ohba et al. ................... 117/76 |
| 6,332,922 | B1 | | 12/2001 | Sakuma et al. ................ 117/3 |
| 6,342,312 | B2 | | 1/2002 | Oba et al. .................... 428/696 |
| 2002/0020338 | A1 | | 2/2002 | Oba et al. ..................... 117/13 |

FOREIGN PATENT DOCUMENTS

| JP | 10-197701 | 7/1998 |
| JP | 10-330114 | 12/1998 |
| JP | 11-240787 | 9/1999 |
| JP | 11-240798 | 9/1999 |
| JP | 2000-128700 | 5/2000 |

* cited by examiner

Primary Examiner—Robert Kunemund
(74) Attorney, Agent, or Firm—Fitzpatrick, Cella, Harper & Scinto

(57) ABSTRACT

In order to shorten the annealing time to thereby reduce the production cost of a fluoride crystal, the method of heat treating a fluoride crystal of the present invention comprises the steps of: raising the temperature of a fluoride crystal; reducing the raised temperature of the fluoride crystal at a first temperature reducing rate; and then reducing the temperature of the fluoride crystal at a second temperature reducing rate which is larger than the first temperature reducing rate.

10 Claims, 4 Drawing Sheets

METHOD OF HEAT TREATING FLUORIDE CRYSTAL

BACKGROUND OF THE INVENTION

1. Field of the Invention

The present invention belongs to the technical field of methods of heat treating (annealing) a crystal of a fluoride such as calcium fluoride, barium fluoride, strontium fluoride, or the like.

2. Related Background Art

The photolithography is preferably used for production of semiconductor devices such as microprocessors, memories, system LSIs, image sensors, light emitting elements, display elements, and the like. In the field of optical processing such as the photolithography, there has been used an ultraviolet light more frequently. This increases a need for glass materials other than quartz glass, for use in optical parts such as lenses, prisms, halfmirrors, window members, or the like. The fluoride crystal such as of calcium fluoride, barium fluoride, strontium fluoride, lithium fluoride, or the like is preferable as a glass material for optical parts which are required to have a high transmittance.

In the production steps of a fluoride crystal, there is carried out as desired an annealing processing in which the fluoride crystal is heated from room temperature up to a desired temperature and then allowed to be cooled to room temperature, thus relaxing a stress generated inside the crystal.

When the birefringence (double refraction) of a fluoride crystal is measured before and after carrying such an annealing processing, the fluoride crystal will be reduced in birefringence after the annealing.

However, in order to fully exhibit the effect of annealing, annealing processing for a very long period of time is necessary, which has been responsible for increase of the production cost of a fluoride crystal.

SUMMARY OF THE INVENTION

An object of the present invention is to provide a method of heat treating a fluoride crystal that can be carried out in a short period of time and can fully suppress the birefringence.

According to the present invention, there is provided a heat treating method of heat treating a fluoride crystal comprising the steps of: raising the temperature of a fluoride crystal; reducing the thus raised temperature of the fluoride crystal at a first temperature reducing rate; and then reducing the temperature of the fluoride crystal at a second temperature reducing rate which is larger than the first temperature reducing rate.

DETAILED DESCRIPTION OF THE PREFERRED EMBODIMENTS

Preferred embodiments of the present invention will be described below.

In the heat treating method of heat treating a fluoride crystal according to the present invention, firstly, the temperature of the fluoride crystal is raised by heating from an initial temperature state such as room temperature. Then, after the fluoride crystal is maintained at a predetermined annealing temperature for a predetermined period of time, the fluoride crystal heated up to the annealing temperature is subjected to temperature reduction at a first temperature reducing rate. Subsequently, the temperature of the fluoride crystal is further reduced at a second temperature reducing rate which is larger than the first temperature reducing rate.

Hereinafter, the preferred embodiments of the present invention will be described more specifically.

(Preparation Step)

At first, the preparation step of a fluoride crystal to be annealed will be described.

A powdery or granular, raw material of a chemically synthesized fluoride is put into a crucible for refining, and a scavenger such as zinc fluoride for removing oxygen is mixed therewith as the occasion demands. The crucible for refining is heated to melt the fluoride raw material and is then allowed to be cooled, thus making a mass of a refined fluoride.

Next, after the mass is ground in suitable sizes, put into a crucible for crystal growth and molten, slow cooling accompanied with crystal growth is carried out using the Bridgeman method, the Czochralski method or the like to obtain a fluoride crystal.

(Annealing Step)

The thus obtained fluoride crystal is put into an annealing furnace.

Figure 1:
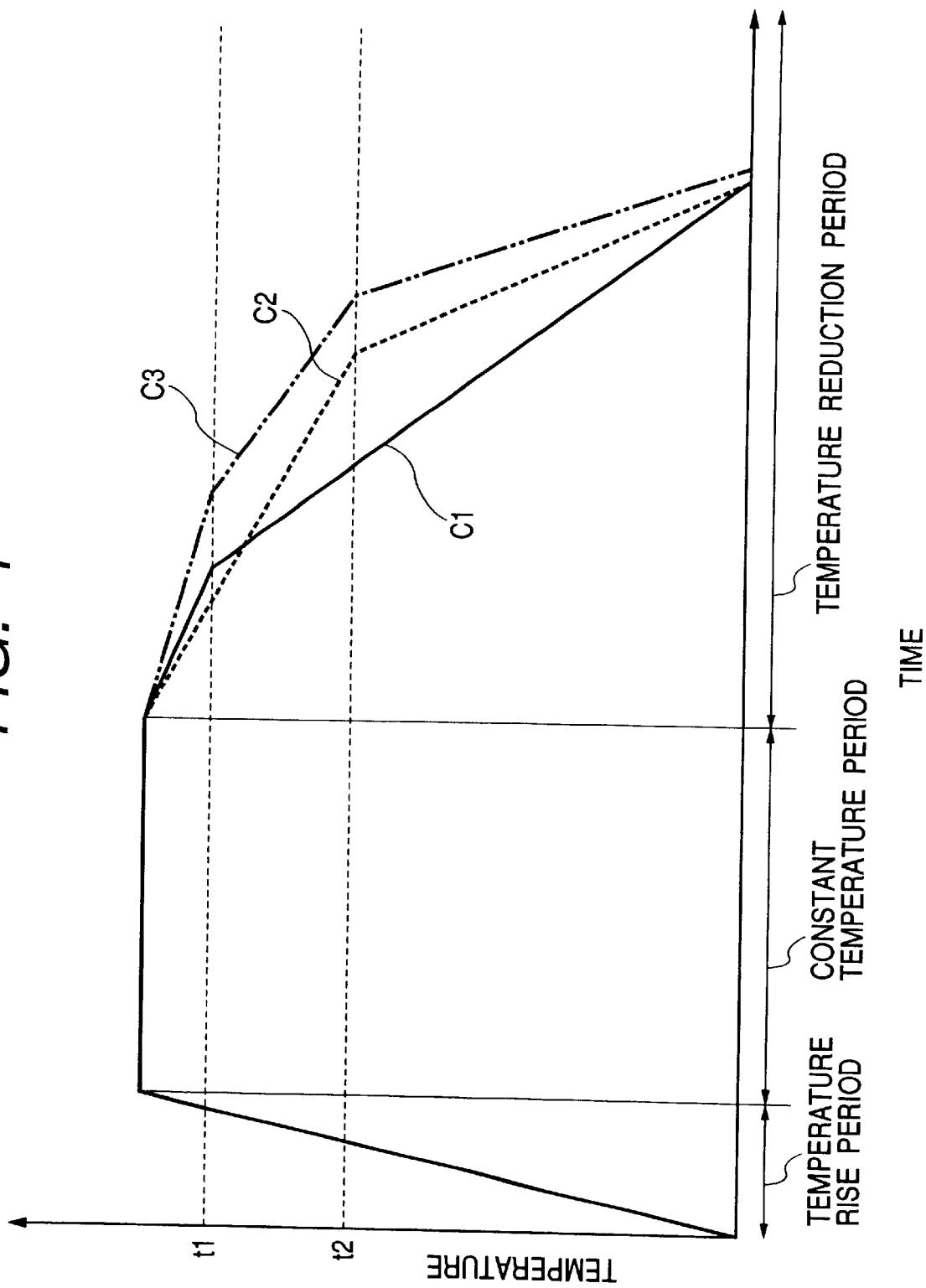
FIG. 1 is a graph showing an example of the temperature change of a fluoride crystal in the annealing step according to the present invention.
Figure 2:
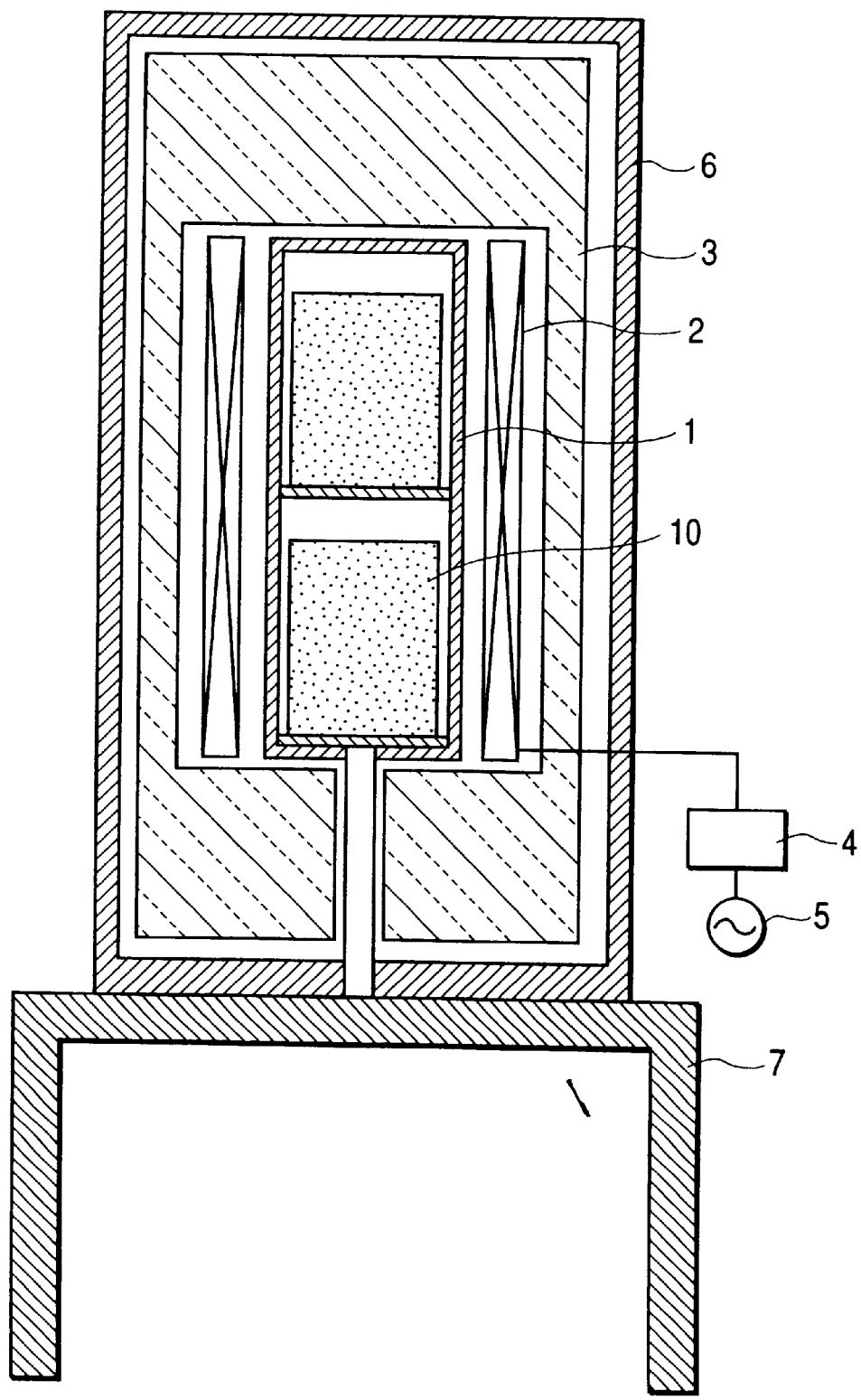
FIG. 2 is a schematic cross sectional view showing an annealing furnace used in the present invention.

FIG. 1 is a graph showing an example of the temperature change of a fluoride crystal in the annealing step. FIG. 2 is a schematic cross sectional view showing an annealing furnace used in the present invention.

In FIG. 2, reference numeral 1 denotes an annealing crucible for containing a fluoride crystal 10 therein; 2 a heater for raising the temperature; 3 a heat insulating material; 4 a controlling device for controlling the quantity of electricity supplied to the heater 2; 5 a power source; 6 a housing; and 7 a supporting stand. The quantity of electricity supplied to the heater is controlled while monitoring by means of the controlling device 4 the temperature of the fluoride crystal 10 in the crucible 1 detected by a temperature sensor (not shown).

First, the quantity of supplied electricity is increased gradually by means of the controlling device to raise the heating temperature of the heater, thus raising the temperature of the fluoride.

When a predetermined annealing temperature set to be lower than the melting point of the fluoride has been reached, the quantity of supplied electricity is kept constant to maintain the fluoride crystal at a constant temperature state for a predetermined period of time.

Then, the temperature of the fluoride crystal is reduced as shown by references C1 to C3. The references C1 to C3 show multistep, non-linear cooling processes.

In the process shown by the reference C1, before reaching a relatively high first temperature t1, the quantity of supplied electricity is gradually decreased to effect temperature reduction at a relatively small temperature reducing (cooling) rate so as not to generate a new thermal strain.

Subsequently, the slow cooling is continued, and after passing the first temperature t1, the fluoride crystal is slowly cooled to effect temperature reduction at a relatively large temperature reducing (cooling) rate.

The annealed fluoride crystal thus obtained has a reduced residual stress with less strain and birefringence.

In the process shown by the reference C2, before reaching a relatively low second temperature t2, the fluoride crystal is slowly cooled to effect temperature reduction at a relatively small temperature reducing (cooling) rate. After passing the second temperature t2, the fluoride crystal is slowly cooled to effect temperature reduction at a relatively large temperature reducing (cooling) rate.

The annealed fluoride crystal thus obtained also has a reduced residual stress with less strain and birefringence.

In the process shown by the reference C3, before reaching the first temperature t1, the fluoride crystal is slowly cooled to effect temperature reduction at a relatively small temperature reducing (cooling) rate. Subsequently, the slow cooling is continued at a moderate temperature reducing rate up to the second temperature, and after passing the second temperature t2, the fluoride crystal is slowly cooled to effect temperature reduction at a relatively large second temperature reducing (cooling) rate.

The annealed fluoride crystal thus obtained also has a reduced residual stress with less strain and birefringence.

Besides the above described stepwise change of the temperature reducing rate, it is also desirable to increase the temperature reducing rate successively with the elapse of time from the beginning to the completion of temperature reduction, that is, to successively increase the temperature reducing acceleration.

The control of the temperature raising or reducing rate can be effected by adjusting the current supplied to the heat generating member for heating.

In case where a calcium fluoride crystal which is a fluoride crystal capable of easily attaining a large diameter crystal is annealed, the annealing temperature is set to be not less than about 1000° C. and less than the melting point of calcium fluoride.

At this time, the preferred temperature raising rate is 10° C./hour to 50° C./hour.

Subsequently, the fluoride crystal is kept at about 1000° C. for 10 to 100 hours.

Thereafter, the fluoride crystal is slowly cooled as described above with reference to FIG. 1.

It is preferred that the first temperature t1 is 900° C. and the second temperature t2 is 600° C.

In the process shown by the reference C1, before reaching 900° C., the first temperature reducing rate is set to be 0.5° C./hour to 5° C./hour so as not to generate a new thermal strain. Subsequently, the fluoride crystal is slowly cooled to effect temperature reduction at the second temperature reducing rate of 5° C./hour to 10° C./hour.

In the process shown by the reference C2, before reaching 600° C., the fluoride crystal is slowly cooled to effect temperature reduction at a first temperature reducing rate. Subsequently, the slow cooling is continued, and after passing 600° C., the fluoride crystal is slowly cooled to effect temperature reduction at a second temperature reducing rate.

In the process shown by the reference C3, before reaching 900° C., the fluoride crystal is slowly cooled to effect temperature reduction at a rate of 0.5° C./hour to 5° C./hour.

Subsequently, the slow cooling is continued at a moderate temperature reducing rate, e. g., 3° C./hour to 8° C./hour up to 600° C., and after passing 600° C., the fluoride crystal is slowly cooled to effect temperature reduction at a rate of 5° C./hour to 15° C./hour.

The temperature as the critical point at which the temperature reducing rate is changed is preferably set to be not more than 900° C., and more preferably set to be 600° C. to 900° C., in order to fully prevent a thermal strain from being generated.

On the other hand, when there is a need to reduce the processing time, the temperature reducing rate is changed to a relatively larger one preferably at a temperature of 900° C. or less, more preferably at a temperature between 900° C. and 600° C.

Thus, it is preferred that the temperature as the critical point lies in the range between 600° C. and 900° C.

Further, although the atmosphere inside the furnace during annealing is not particularly limited, an inert gas atmosphere or an atmosphere comprising a fluorine-containing gas is preferred.

(Method of Producing Optical Part)

Thereafter, the thus obtained fluoride crystal is worked to be shaped into disc, convex lens, concave lens, prism or the like. Thus, optical parts such as lenses, mirrors, windows, etc. are produced.

Further, as the occasion demands, a thin film such as of aluminum oxide, silicon oxide, aluminum fluoride, magnesium fluoride or the like is formed on a surface of the thus molded optical product by a film forming method such as sputtering, CVD, evaporation, and the like. Such a film can be formed in a single layer or stacked layers to function as an antireflection film, a reflection enhancing film, a filter, or the like.

The thus obtained optical parts can suitably be combined to produce an optical apparatus such as a laser oscillator, an aligner, etc.

Figure 3:
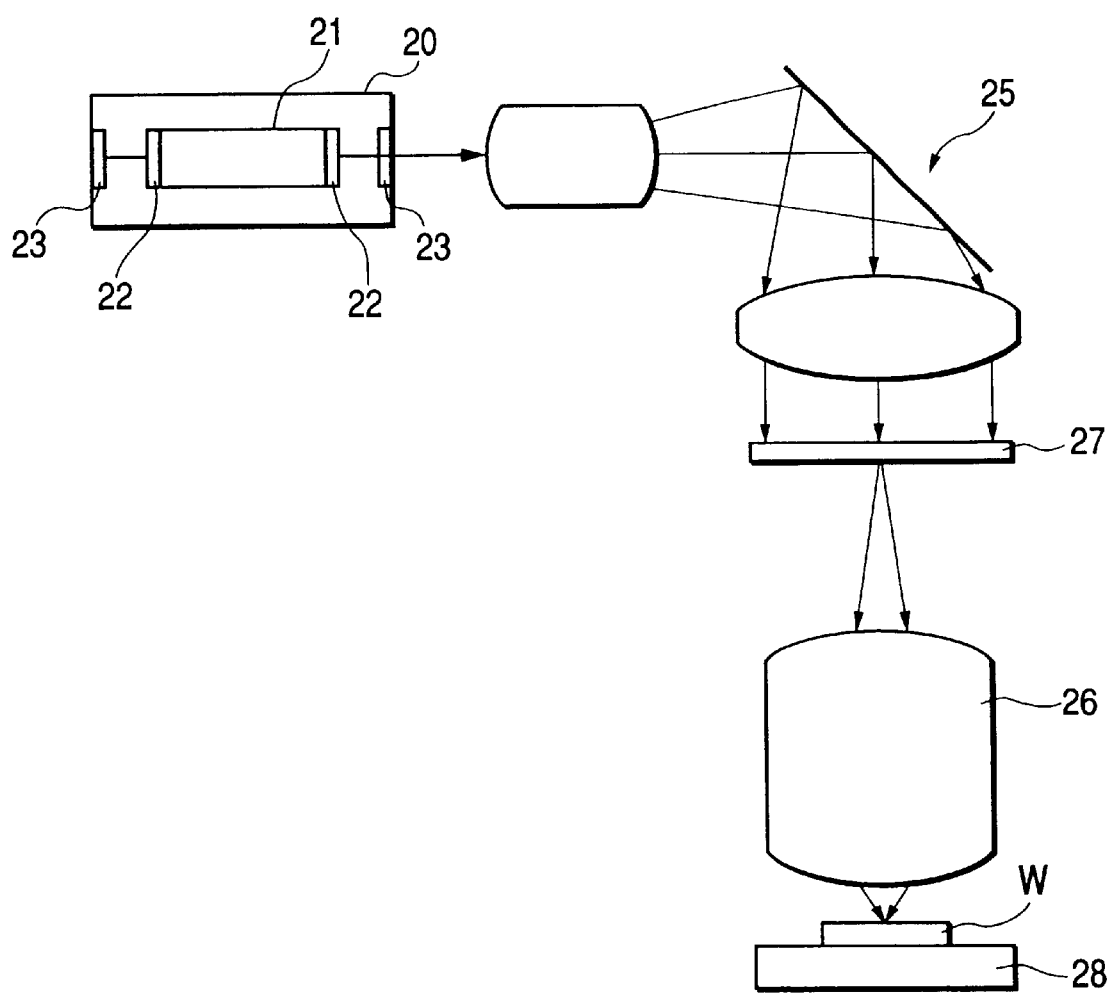
FIG. 3 is a schematic view showing an optical apparatus using the optical part according to the present invention.

FIG. 3 is a schematic view showing an aligner with a laser oscillator for photolithography as an example of such an optical apparatus.

A laser oscillator 20 for emitting a vacuum ultraviolet light such as ArF excimer laser, $F_2$ excimer laser or the like includes a laser gas chamber 21, a pair of windows 22 made of calcium fluoride, and a laser cavity 23.

The aligner includes an illumination optical system 25 and an image-formation optical system 26, each of which consists of a group of plural optical parts such as lenses, mirrors, and so on.

A light emitted from the laser oscillator 20 passes through the illumination optical system 25 to be irradiated on a reticle 27 as an optical mask. The light passing through the reticle 27 further passes thorough the image-formation optical system 26 to form an optical image of the reticle 27 on a member to be exposed (work) W placed on a stage 28 as a holding means.

Representative examples of the work W includes substrates such as an Si wafer, a glass plate having a photoresist thereon. With an aligner of the step and repeat type, the operation is repeated in which after an area corresponding to one section of the work W is exposed, the stage 28 is moved and an area corresponding to another section of the same work W is exposed. With an aligner of the scanning type, image formation and exposure are carried out over the entire surface of the work W while moving the reticle 27 and the stage 28 relatively to each other.

The photoresist having a latent image formed therein by this exposure is then developed and used as a mask pattern for etching or ion implantation.

Thereafter, the mask pattern is used to implant ions in a substrate or etch a surface of a substrate.

Thus, fine processing of a substrate becomes possible.

EXAMPLES

Hereinafter, the present invention will be described in more detail with reference to Examples.

Example 1

A drum-like calcium fluoride crystal of 250 mm in diameter and about 10 kg weight grown by the Bridgeman method was put in a crucible for annealing and heated to 1000° C. in 30 hours.

Thereafter, the calcium fluoride crystal was kept at 1000° C. for 30 hours.

Then, the calcium fluoride crystal was slowly cooled at a temperature reducing rate of about 2° C./hour to 900° C. in 50 hours, and was further cooled at a temperature reducing rate of about 5.8° C./hour from 900° C. to room temperature in 150 hours.

The thus annealed calcium fluoride crystal was measured for the quantity of birefringence under polarization by the Sénarmont method. The quantity makes it possible to evaluate the magnitude of residual stress exerted in the crystal.

As a result of the measurement, the optical path difference per centimeter (per unit cm) was 5 nm/cm or less at the center of the crystal and 10 nm/cm or less at the peripheral portion of the crystal as shown in the Table below.

Comparative Example 1

A drum-like calcium fluoride crystal of 250 mm in diameter and about 10 kg weight grown by the Bridgeman method was put in a crucible for annealing and heated to 1000° C. in 30 hours.

Thereafter, the calcium fluoride crystal was kept at 1000° C. for 30 hours.

Then, the calcium fluoride crystal was slowly cooled at a temperature reducing rate of about 3.9° C./hour to room temperature in 250 hours.

As a result of the same measurement as in Example 1, the optical path difference per centimeter was 10 nm/cm or less at the center of the crystal and 20 nm/cm or more at the peripheral portion of the crystal as shown in the Table below.

Comparative Example 2

A drum-like calcium fluoride crystal of 250 mm in diameter and about 10 kg weight grown by the Bridgeman method was put in a crucible for annealing and heated to 1000° C. in 30 hours.

Thereafter, the calcium fluoride crystal was kept at 1000° C. for 30 hours.

Then, the calcium fluoride crystal was cooled at a temperature reducing rate of about 1.9° C./hour to room temperature in 500 hours.

The thus annealed calcium fluoride crystal was measured for the quantity of birefringence under polarization in the same manner as in Example 1. The quantity makes it possible to evaluate the magnitude of residual stress exerted in the crystal.

As a result of the measurement, the optical path difference per centimeter was 5 nm/cm or less at the center of the crystal and 10 nm/cm or less at the peripheral portion of the crystal as shown in the Table below, but the annealing time took 560 hours in total, which was over two times that in Example 1.

Figure 4:
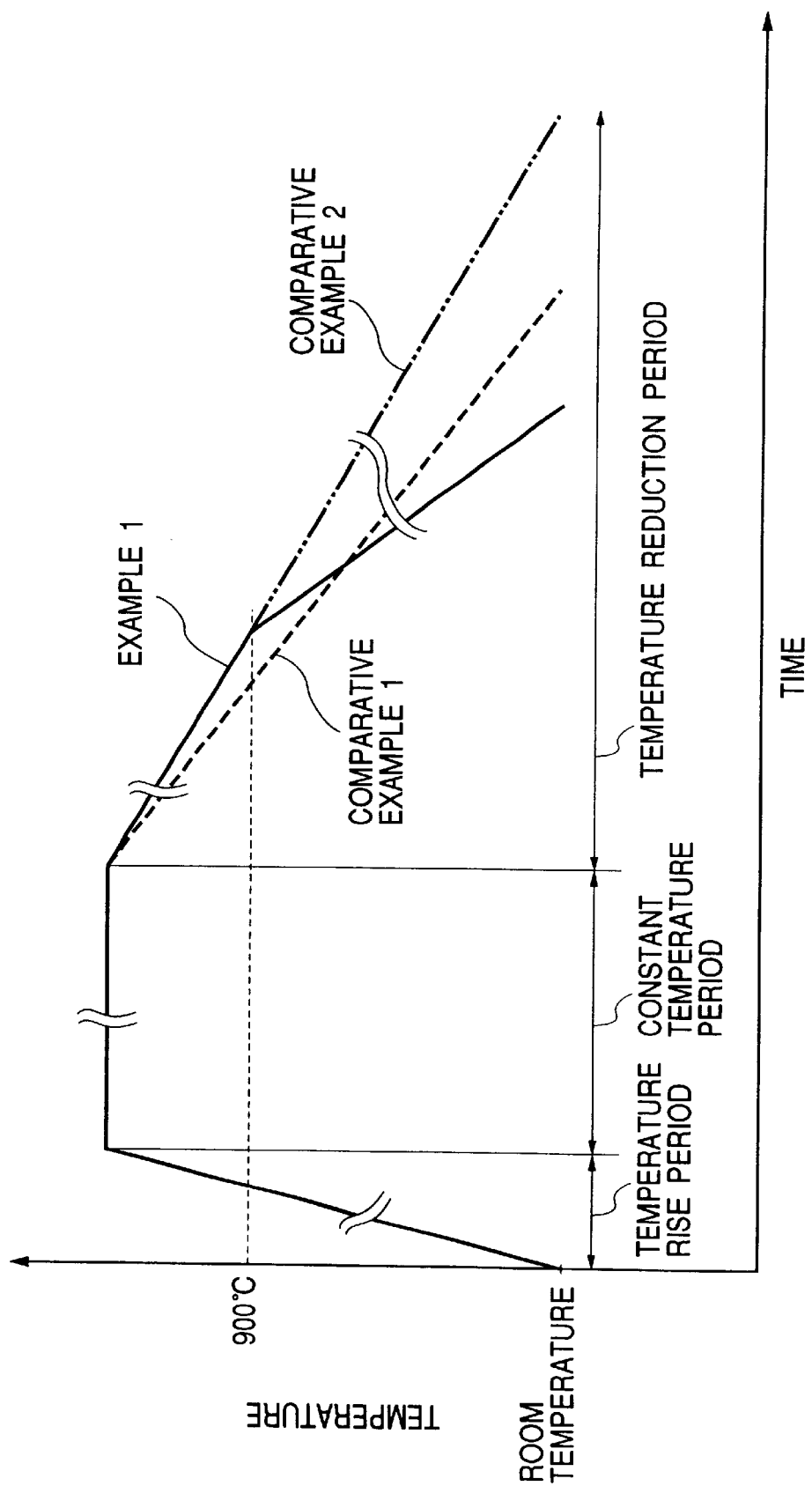
FIG. 4 is a graph showing another example of the temperature change of a fluoride crystal in the annealing step in an Example of the present invention.

FIG. 4 shows the patterns of temperature change of Example 1 and Comparative Examples 1 and 2.

TABLE

| | Annealing Time | Optical Path Difference Per Centimeter (Magnitude of Strain) | |
| --- | --- | --- | --- |
| | | Center Portion | Peripheral Portion |
| Comparative Example 1 | 310 hours | 10 nm/cm or less | 20 nm/cm or more |
| Comparative Example 2 | 560 hours | 5 nm/cm or less | 10 nm/cm or less |
| Example 1 | 260 hours | 5 nm/cm or less | 10 nm/cm or less |

As described in detail above, according to the present invention, when the fluoride crystal is in a relatively high temperature state, it is subjected to a slow temperature reduction such that the temperature reducing rate at the inner portion of the fluoride crystal follows the temperature reducing rate at the peripheral portion of the fluoride crystal, whereby a new thermal strain is prevented from being generated inside the crystal. Further, when the fluoride crystal is in a relatively low temperature state, since a new thermal strain is difficult to be generated, the temperature reducing rate can be made as large as possible. Thus, fluoride crystals can be produced at a low production cost. Further, the thus obtained fluoride crystal can also form an optical part for vacuum ultraviolet light with high durability and a superior transmittance, which is suitable for an optical apparatus such as a laser oscillator, an aligner, etc.

What is claimed is:

1. A method for heat treating a fluoride crystal comprising the steps of:
   raising the temperature of a fluoride crystal;
   reducing the raised temperature of the fluoride crystal by increasing a temperature reducing rate successively with elapse of time from beginning to completion of the temperature reduction,
   wherein the temperature reducing rate is from 0.5° C./hour to 5° C./hour at temperatures higher than 900° C., from 3° C./hour to 8° C./hour at temperatures from 900° C. to 600° C., and from 5° C./hour to 15° C./hour at temperatures lower than 600° C.

2. A method for heat treating a fluoride crystal comprising the steps of:
   raising the temperature of a fluoride crystal;
   reducing the raised temperature of the fluoride crystal by increasing a temperature reducing rate successively with elapse of time from beginning to completion of the temperature reduction,
   wherein the temperature reducing rate is from 0.5° C./hour to 5° C./hour at temperatures higher than 900° C. and is from 5° C./hour to 10° C./hour at temperatures lower than 900° C.

3. A method of producing an optical part comprising processing the fluoride crystal heat treated by the heat treating method as set forth in claim 1.

4. An optical apparatus for vacuum ultraviolet light produced using the optical part produced by the producing method as set forth in claim 3.

5. The optical apparatus according to claim 4, which is a laser oscillator using the optical part as a window member.

6. The optical apparatus according to claim 4, which is an aligner comprising an optical system comprising the optical part, a laser oscillator and a holding means for holding a work.

7. A method of producing an optical part comprising processing the fluoride crystal heat treated by the heat treating method as set forth in claim 2.

8. An optical apparatus for vacuum ultraviolet light produced using the optical part produced by the producing method as set forth in claim 7.

9. The optical apparatus according to claim 8, which is a laser oscillator using the optical part as a window member.

10. The optical apparatus according to claim 8, which is an aligner comprising an optical system comprising the optical part, a laser oscillator and a holding means for holding a work.

* * * * *